(12) United States Patent
Mitra et al.

(10) Patent No.: US 11,164,938 B2
(45) Date of Patent: Nov. 2, 2021

(54) DRAM CAPACITOR MODULE

(71) Applicant: Micromaterials LLC, Wilmington, DE (US)

(72) Inventors: Uday Mitra, Cupertino, CA (US); Regina Freed, Los Altos, CA (US); Ho-yung David Hwang, Cupertino, CA (US); Sanjay Natarajan, Portland, OR (US); Lequn Liu, San Jose, CA (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/826,597

(22) Filed: Mar. 23, 2020

(65) Prior Publication Data

US 2020/0312953 A1    Oct. 1, 2020

Related U.S. Application Data

(60) Provisional application No. 62/823,977, filed on Mar. 26, 2019.

(51) Int. Cl.
*H01L 27/108* (2006.01)
*H01L 49/02* (2006.01)

(52) U.S. Cl.
CPC ........ *H01L 28/91* (2013.01); *H01L 27/10808* (2013.01); *H01L 27/10852* (2013.01)

(58) Field of Classification Search
CPC ... H01L 28/90–92; H01L 28/40; H01L 28/56; H01L 28/60; H01L 28/75; H01L 29/945; H01L 29/66181; H01L 29/66182; H01L 27/1085–1087; H01L 27/10861; H01L 23/5222–5223

See application file for complete search history.

(56) References Cited

U.S. PATENT DOCUMENTS

| | | | |
|---|---|---|---|
| 4,671,970 A | 6/1987 | Keiser et al. | |
| 5,824,597 A | 10/1998 | Hong | |
| 6,130,151 A | 10/2000 | Lin et al. | |
| 6,143,653 A | 11/2000 | Tsai et al. | |
| 6,251,740 B1 * | 6/2001 | Johnson | H01L 21/76838 257/E21.008 |

(Continued)

FOREIGN PATENT DOCUMENTS

| | | |
|---|---|---|
| JP | 2008108757 A | 5/2008 |
| JP | 2011060803 A | 3/2011 |

(Continued)

OTHER PUBLICATIONS

PCT International Search Report and Written Opinion in PCT/US2017/037141 dated Aug. 31, 2017, 11 pages.

(Continued)

*Primary Examiner* — Jarrett J Stark
(74) *Attorney, Agent, or Firm* — Servilla Whitney LLC

(57) ABSTRACT

Methods of forming and processing semiconductor devices are described. Certain embodiments relate to the formation of self-aligned DRAM capacitors. More particularly, certain embodiments relate to the formation of self-aligned DRAM capacitors utilizing the formation of self-aligned growth pillars. The pillars lead to greater capacitor heights, increase critical dimension uniformity, and self-aligned bottom and top contacts.

16 Claims, 9 Drawing Sheets

(56) References Cited

U.S. PATENT DOCUMENTS

| | | | |
|---|---|---|---|
| 6,271,084 B1* | 8/2001 | Tu | H01L 28/60 257/E21.009 |
| 6,417,535 B1* | 7/2002 | Johnson | H01L 23/5223 257/296 |
| 6,441,419 B1* | 8/2002 | Johnson | H01L 21/76838 257/296 |
| 6,528,884 B1 | 3/2003 | Lopatin et al. | |
| 6,576,113 B1 | 6/2003 | Scherer et al. | |
| 6,653,200 B2 | 11/2003 | Olsen | |
| 6,750,499 B2 | 6/2004 | Wu | |
| 6,767,788 B2* | 7/2004 | Kim | H01L 21/76843 438/253 |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,796,372 B2* | 9/2010 | Cremer | H01L 23/53238 361/287 |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,666,451 B2 | 5/2017 | Wallace et al. | |
| 9,679,781 B2 | 6/2017 | Abatchez et al. | |
| 9,721,888 B2 | 8/2017 | Chang et al. | |
| 9,837,314 B2 | 12/2017 | Smith et al. | |
| 10,083,834 B2 | 9/2018 | Thompson et al. | |
| 10,319,604 B2 | 6/2019 | Duan et al. | |
| 10,319,636 B2 | 6/2019 | Basu et al. | |
| 2002/0098642 A1 | 7/2002 | Harris et al. | |
| 2002/0163081 A1 | 11/2002 | Aoyama | |
| 2003/0073282 A1* | 4/2003 | Ning | H01L 28/90 438/243 |
| 2003/0143862 A1 | 7/2003 | Iyer | |
| 2003/0183862 A1* | 10/2003 | Jin | H01L 23/5223 257/301 |
| 2004/0029342 A1 | 2/2004 | Wu | |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1 | 8/2006 | Brown et al. | |
| 2006/0286806 A1 | 12/2006 | Ohkuni et al. | |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1 | 7/2008 | Elers | |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2010/0078617 A1 | 4/2010 | Breitwisch et al. | |
| 2010/0096691 A1 | 4/2010 | Shin et al. | |
| 2010/0171220 A1 | 7/2010 | Cheng-Lin | |
| 2010/0173494 A1 | 7/2010 | Kobrin | |
| 2010/0203725 A1 | 8/2010 | Choi et al. | |
| 2010/0301480 A1 | 12/2010 | Choi et al. | |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1 | 10/2013 | Cheong et al. | |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1 | 11/2014 | Zhang et al. | |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 | 10/2015 | Shaviv | |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0141416 A1 | 5/2016 | Mariani et al. | |
| 2016/0163587 A1 | 6/2016 | Backes et al. | |
| 2016/0163640 A1 | 6/2016 | Edelstein et al. | |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0338149 A1 | 11/2017 | Lin | |
| 2018/0096847 A1* | 4/2018 | Thompson | H01L 21/32133 |
| 2018/0130657 A1* | 5/2018 | Duan | H01L 21/76897 |
| 2018/0130671 A1 | 5/2018 | Duan et al. | |
| 2018/0144580 A1 | 5/2018 | Basu et al. | |
| 2018/0286749 A1* | 10/2018 | Zhang | H01L 21/76811 |
| 2018/0358260 A1* | 12/2018 | Roy | H01J 37/32165 |
| 2018/0374750 A1 | 12/2018 | Zhang et al. | |
| 2019/0067103 A1* | 2/2019 | Zhang | H01L 21/76897 |
| 2019/0074219 A1* | 3/2019 | Zhang | H01L 21/76897 |
| 2019/0273019 A1* | 9/2019 | Mullick | H01L 21/32134 |
| 2019/0279900 A1* | 9/2019 | Mullick | C23C 14/0623 |
| 2019/0348322 A1* | 11/2019 | Mullick | H01L 21/31111 |
| 2019/0355620 A1* | 11/2019 | Freed | H01L 21/02175 |
| 2019/0355621 A1* | 11/2019 | Marcadal | H01L 21/76879 |
| 2019/0378756 A1* | 12/2019 | Mullick | H01L 23/5226 |
| 2020/0168503 A1* | 5/2020 | Roy | H01L 21/76897 |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |
| WO | 2016/106092 A1 | 6/2016 |
| WO | 2017136577 A1 | 8/2017 |

OTHER PUBLICATIONS

PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.

(56) References Cited

OTHER PUBLICATIONS

PCT International Preliminary Report on Patentability in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.
PCT International Search Report and Written Opinion in PCT/US2018/048509 dated Dec. 13, 2018, 10 pages.
PCT ISR & Written Opinion for PCT/US2018/026026, dated Jul. 26, 2018, 11 pages.
PCT International Search Report and Written Opinion in PCT/US2019/034353 dated Sep. 19, 2019, 9 pages.

\* cited by examiner

DRAM CAPACITOR MODULE

CROSS-REFERENCE TO RELATED APPLICATIONS

This application claims priority to U.S. Provisional Application No. 62/823,977, filed Mar. 26, 2019, the entire disclosure of which is hereby incorporated by reference herein.

TECHNICAL FIELD

Embodiments of the present invention pertain to the field of semiconductor device manufacturing and methods for device patterning. In particular, embodiments pertain to the self-aligned DRAM devices and their manufacturing methods.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. The output voltage of a DRAM cell is proportional to the capacitance value of the storage capacitor of the DRAM cell and, therefore, the storage capacitor must have a satisfactory capacitance value to have stable operation of the cell as the applied voltage is scaled. The storage capacitor can be implemented in a trench-type or a stack-type. The trench-type capacitor is formed by forming a trench in a semiconductor substrate without increasing the surface area of the semiconductor-substrate surface; however, the trench formation becomes difficult as the feature size decreases. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with nonarray devices.

DRAM cells and circuits may be produced using semiconductor lithography. Modern trends in DRAM production include scaling DRAMs to ever smaller lithography sizes. As sizes are reduced, it becomes more difficult to maintain reliability and performance as lithography error rates increase. Thus, there is a need for DRAMs that are scalable while maintaining reliability and performance.

SUMMARY

One or more embodiments of the disclosure are directed to electronic devices and to methods of manufacturing the electronic devices. In one embodiment, a method of manufacturing a DRAM capacitor comprises: selectively etching a capacitor bottom contact from a substrate comprising the capacitor bottom contact and a first dielectric material to form a recess; forming pillars in the recess on the capacitor bottom contact; depositing a second dielectric material on the first dielectric material; selectively removing the pillars to form capacitor memory holes; conformally depositing a first conductive material in the capacitor memory hole; conformally depositing a third dielectric material on the first conductive material; and depositing a second conductive material on the third dielectric material to form the DRAM capacitor, wherein the capacitor bottom contact is self-aligned with the first conductive material.

In one embodiment, a DRAM capacitor comprises: a capacitor bottom contact and a first dielectric material on a substrate; a second dielectric material on the first dielectric material; a fourth dielectric material on the second dielectric material; a capacitor memory channel formed through the fourth dielectric material and the second dielectric material; and a capacitor formed in the memory channel, wherein the capacitor is self-aligned with the capacitor bottom contact.

In one an embodiment, a method of manufacturing a DRAM capacitor comprises: providing a substrate having a capacitor bottom contact and a first dielectric material; selectively etching the capacitor bottom contact to form a first recess; depositing a conformal liner in the first recess; selectively depositing a first seed layer in the first recess on the capacitor bottom contact; forming first pillars from the first seed layer; depositing a second dielectric material on the first dielectric material to form an overburden of the second dielectric material; removing the overburden of the second dielectric material such that a top surface of the second dielectric material is substantially coplanar with a top surface of the first pillars; selectively etching the first pillars to form a second recess; selectively depositing a second seed layer in the second recess on the first pillars; forming second pillars from the second seed layer; depositing a fourth dielectric material on the second dielectric material to form an overburden of the third dielectric material; removing the overburden of the fourth dielectric material such that a top surface of the fourth dielectric material is substantially coplanar with a top surface of the second pillars; selectively removing the first pillars and the second pillars to form capacitor memory holes; removing the conformal liner; and forming a capacitor in the capacitor memory holes by conformally depositing a first conductive material in the capacitor memory holes, conformally depositing a third dielectric material on the first conductive material, and depositing a second conductive material on the third dielectric material to form the DRAM capacitor, wherein the capacitor is self-aligned with capacitor bottom contact.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
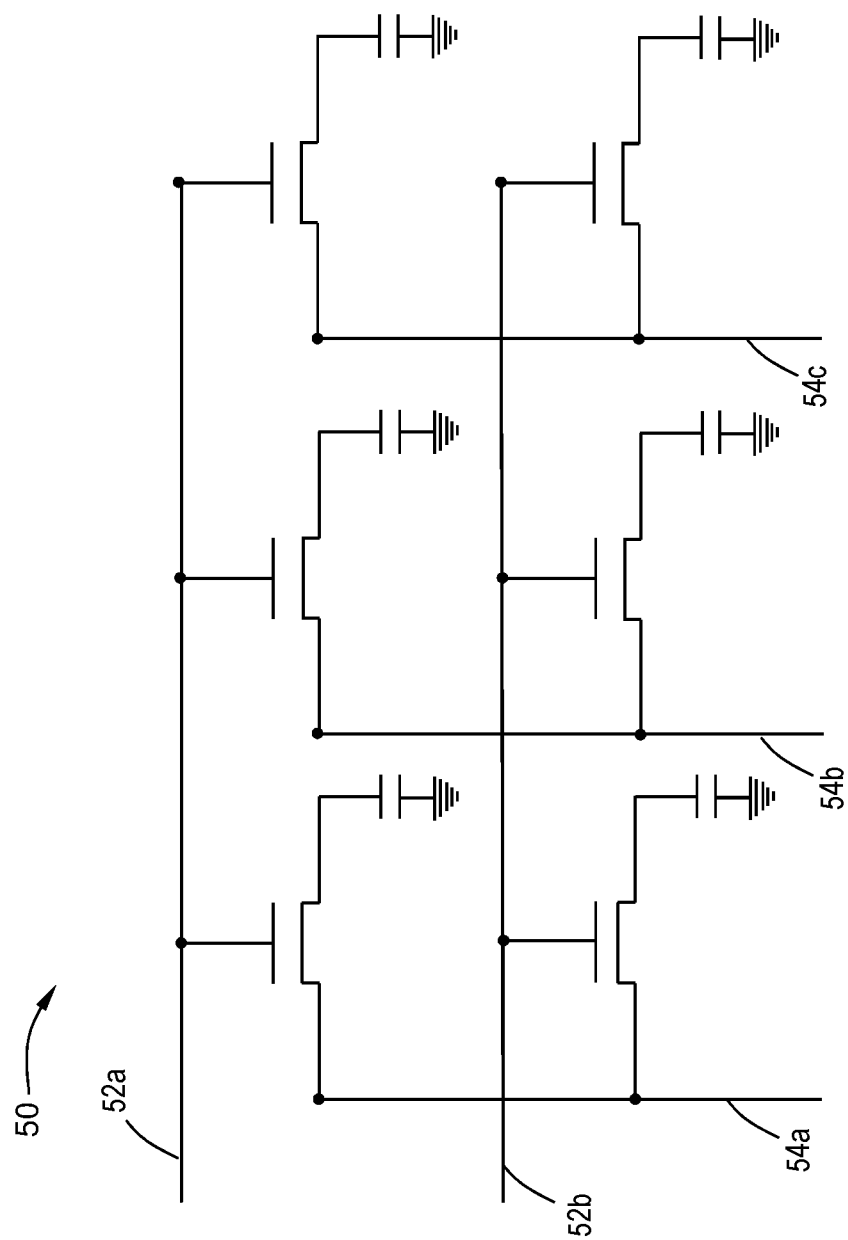
FIG. 1 illustrates a circuit diagram of a DRAM cell block in accordance with the prior art.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device, as illustrated in FIG. 1, is formed of an array of DRAM cells. The rows on access transistors are linked by word lines 52a, 52b, and the transistor inputs/outputs are linked by bit lines 54a, 54b, and 54c. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate.

In one or more embodiments, memory devices, DRAM capacitors in particular, are provided where the capacitor is advantageously self-aligned with the capacitor bottom contact, resulting in a uniform critical dimension, better bottom contact, and increased height of the capacitor.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

Figure 2:
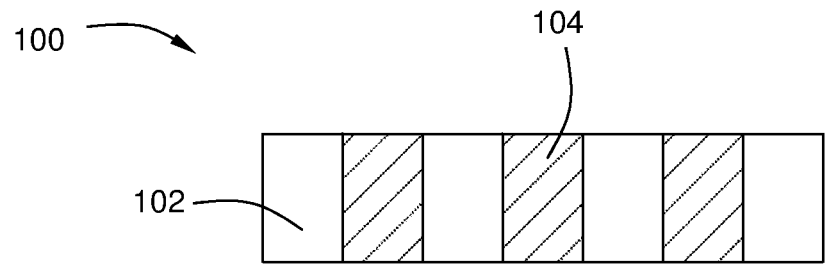
FIG. 2 illustrates a cross-section view of an electronic device according to one or more embodiments of the disclosure.
Figure 3:
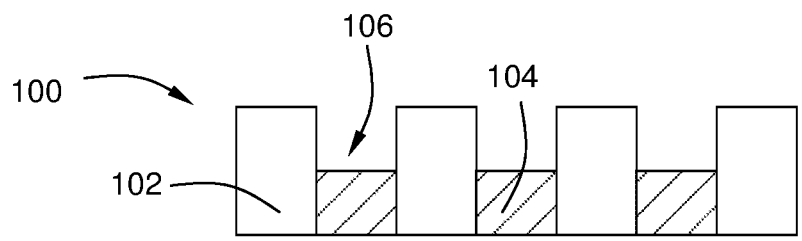
FIG. 3 illustrates a cross-section view of an electronic device according to one or more embodiments of the disclosure.

FIGS. 2 through 21 are cross-sectional views illustrating a memory device 100, a DRAM capacitor for example, according to one or more embodiments. With reference to FIGS. 2 and 3, in one or more embodiments, a capacitor bottom contact 104 is selectively etched from a substrate comprising the capacitor bottom contact 104 and a first dielectric material 102 to form a recess 106.

As used herein, the term "dielectric material" refers to a layer of material that is an electrical insulator that can be polarized in an electric field. In one or more embodiments, the dielectric layer comprises one or more of oxides, carbon doped oxides, silicon oxide (SiO), porous silicon dioxide ($SiO_2$), silicon oxide (SiO), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH).

In one or more embodiments, the first dielectric material can be any suitable material known to the skilled artisan. In one or more embodiments, the first dielectric material 102 comprises silicon oxide or silicon nitride.

In one or more embodiments, the capacitor bottom contact 104 can be any suitable material known to the skilled artisan. In one or more embodiments, the capacitor bottom contact 104 comprises one or more of a metal, a metal silicide, poly-silicon, or EPI-silicon. In one or more embodiments, the capacitor bottom contact 104 is doped by either N type dopants or P type dopants in order to reduce contact resistance. In one or more embodiments, the metal of the capacitor bottom contact 104 is selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

Figure 4:
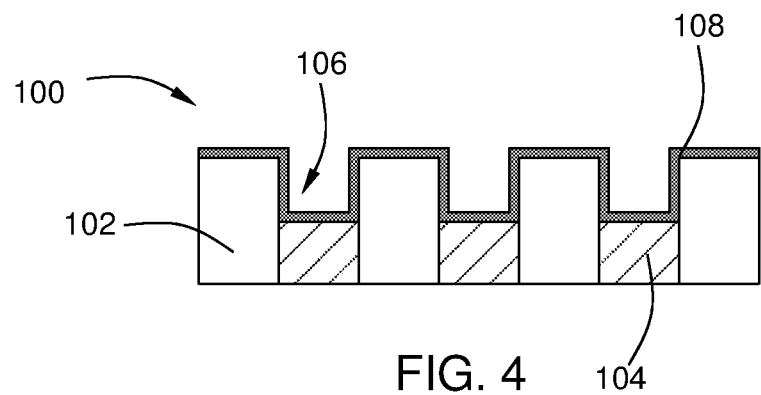
FIG. 4 illustrates a cross-section view of an electronic device according to one or more embodiments of the disclosure.

In one or more embodiments, as illustrated in FIG. 4, a conformal liner 108 is optionally deposited on the first dielectric material 102 and the recessed capacitor bottom contact 104. In one or more embodiments, the optional liner 108 can be conformal liner 108. In one or more embodiments, the conformal liner 108 is selected from a conductive liner or a dielectric liner. In one or more embodiments, the conformal liner 108 can be any suitable metal liner material known to the skilled artisan. In one or more embodiments, the conformal liner 108 comprises a metal nitride film. In some embodiments, the conformal liner 108 comprises one or more of tungsten nitride, tantalum nitride, or titanium nitride.

As used herein, a layer or a liner which is "substantially conformal" refers to a layer where the thickness is about the same throughout (e.g., on the dielectric material 102, on the sidewalls of the recess 106, and on the recessed capacitor bottom contact 104). A layer which is substantially conformal varies in thickness by less than or equal to about 5%, 2%, 1% or 0.5%.

Figure 5:
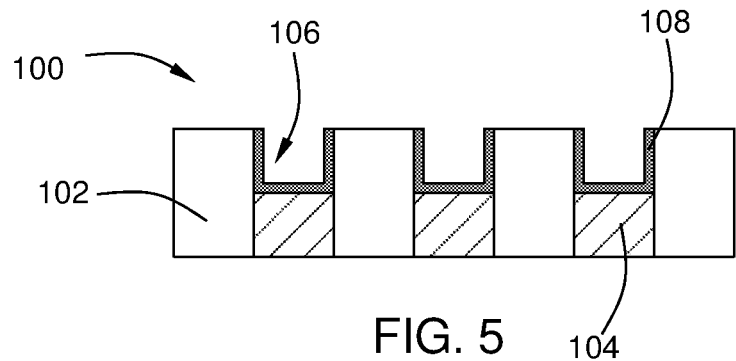
FIG. 5 illustrates a cross-section view of an electronic device according to one or more embodiments of the disclosure.
Figure 6:
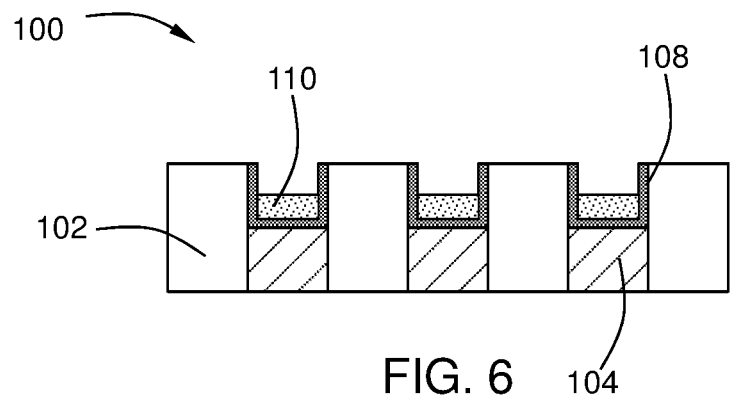
FIG. 6 illustrates a cross-section view of an electronic device according to one or more embodiments of the disclosure.
Figure 7:
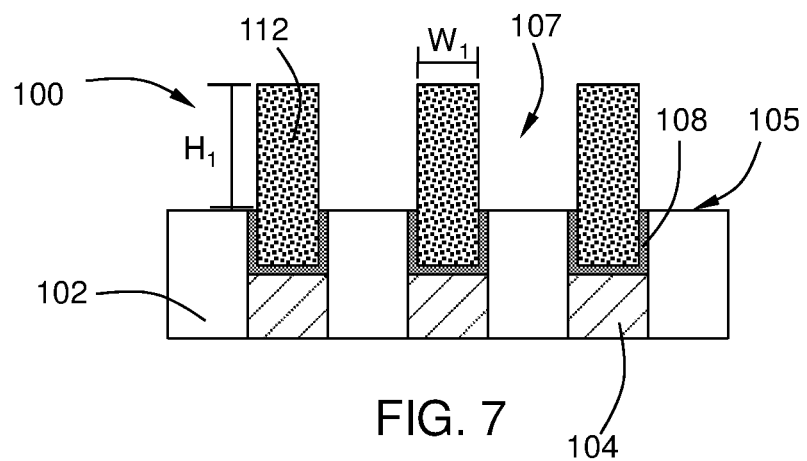
FIG. 7 illustrates a cross-section view of an electronic device according to one or more embodiments of the disclosure.

Referring to FIG. 5, the conformal liner 108 is removed from the top surface of the dielectric material 102. In other embodiments, the conformal liner 108 is not present. Referring to FIGS. 6 and 7, pillars 112 are formed in the recess 106 on the capacitor bottom contact 104.

In one or more embodiments, selective pillar growth technique is used to grow pillars 112 on the capacitor bottom contact 104. Pillars 112 are formed on the capacitor bottom contact 104. FIG. 7 illustrates pillars 112 being grown on an optional liner 108. Referring to FIG. 6, in one or more embodiments, self-aligned selective growth pillars 112 are formed using a seed gapfill layer 110, optionally on the liner 108, on the recessed conductive lines of the capacitor bottom contact 104.

As used herein, the term "self-aligned growth pillars" refers to columns or towers of a metal (e.g. tungsten) that are used to form self-aligned capacitor memory holes. The self-aligned growth pillars have a height $H_1$ of about 5 angstroms (Å) to about 10 microns (μm) that extends above the top surface 105 of the electronic device 100. The width $W_1$ of the self-aligned growth pillars is in a range of about 0.5 nm to about 2000 nm.

As shown in FIG. 7, the pillars 112 extend substantially orthogonally from the top surface 105 of the electronic device 100. As shown in FIG. 7, the pillars 112 extend along the same direction as the conductive lines of the capacitor bottom contact 104, and are separated by gaps 107.

With reference to FIG. 6, in one or more embodiments, a seed gapfill layer 110 is deposited on the capacitor bottom contact 104. In one embodiment, the seed gapfill layer 110 is a self-aligned selective growth seed film. In one or more embodiments, the seed gapfill layer 110 is deposited on capacitor bottom contact 104 on the top surface of the recessed conductive lines. In one or more embodiments, the seed gapfill layer 110 is a tungsten (W) layer, or other seed gapfill layer to provide selective growth pillars 112. In some embodiments, the seed gapfill layer 110 is a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, the seed gapfill layer 110 is a tungsten (W) seed gapfill layer.

In one or more embodiments, the seed gapfill layer 110 is deposited using one or more deposition techniques, such as but not limited to ALD, CVD, PVD, MBE, MOCVD, spin-on or other deposition techniques known to one of ordinary skill in the art of microelectronic device manufacturing.

In one or more embodiments, portions of the seed gapfill layer 110 above the capacitor bottom contact 104 are expanded for example, by oxidation, nitridation, or other process to grow pillars 112. In one embodiment, the seed gap fill layer 112 is oxidized by exposure to an oxidizing agent or oxidizing conditions to transform the metal or metal containing seed gapfill layer 110 to metal oxide pillars 112. In one or more embodiments, pillars 112 include an oxide of one or more metals listed above. In more specific embodiment, pillars 112 include tungsten oxide (e.g., WO, $WO_3$ and other tungsten oxide).

The oxidizing agent can be any suitable oxidizing agent including, but not limited to, $O_2$, $O_3$, $N_2O$, $H_2O$, $H_2O_2$, CO, $CO_2$, $NH_3$, $N_2/Ar$, $N_2/He$, $N_2/Ar/He$ or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one or more embodiments, the pillars 112 are formed by oxidation of the seed gapfill layer 110 at any suitable temperature depending on, for example, the composition of the seed gapfill layer 110 and the oxidizing agent. In some embodiments, the oxidation occurs at a temperature in an approximate range of about 25° C. to about 800° C. In some embodiments, the oxidation occurs at a temperature greater than or equal to about 150° C.

Figure 8:
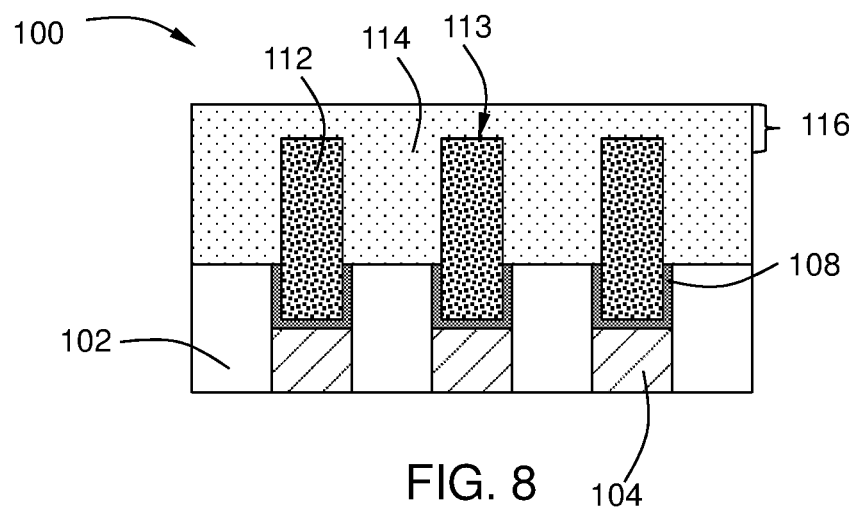
FIG. 8 illustrates a cross-section view of an electronic device according to one or more embodiments of the disclosure.

In one or more embodiments, deposition or formation of a material may be performed by any suitable technique known to the skilled artisan including, but not limited to, atomic layer deposition (ALD), chemical vapor deposition (CVD), physical vapor deposition (PVD), and the like. Referring to FIG. 8, a second dielectric material 114 is deposited on the first dielectric material 102 and on the top surface 113 of the pillars 112. In one or more embodiments, the second dielectric material 114 can be any suitable material known to the skilled artisan. In one or more embodiments, the second dielectric material 114 comprises silicon oxide or silicon nitride. In one or more embodiments, the second dielectric material 114 is the same material as the first dielectric material 102.

Figure 9:
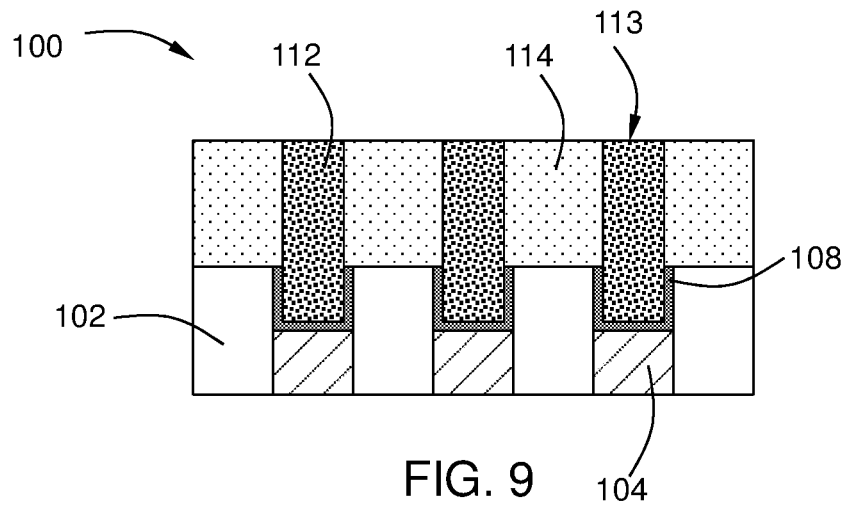
FIG. 9 illustrates a cross-section view of an electronic device according to one or more embodiments of the disclosure.

As illustrated in FIG. 8, in one or more embodiments, an overburden 116 of the second dielectric material 114 is formed. Referring to FIG. 9, the overburden 116 may be removed by any suitable technique known to one of skill in the art including, but not limited to, chemical mechanical planarization (CMP), dry etching, or wet etching. In one or more embodiments, when the overburden 116 of the second dielectric material 114 is removed, the second dielectric material 114 is substantially coplanar with the top surface 113 of the pillars 112.

Figure 10A:
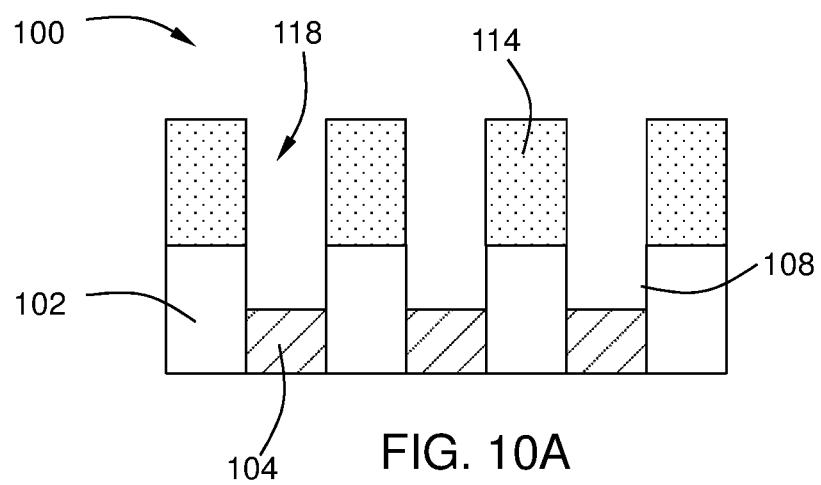
FIG. 10A illustrates a cross-section view of an electronic device according to one or more embodiments of the disclosure.

Referring to FIG. 10A, in one or more embodiments, the pillars 112 are selectively removed to form capacitor memory holes 118. In one or more embodiments, the capacitor memory holes 118 are self-aligned with the capacitor bottom contact 104. In one or more embodiments, the self-aligned capacitor memory holes 118 have a minimum width that is equal to the width of the self-aligned growth pillars 112.

As shown in FIG. 10A, the pillars 112 are removed selectively to the capacitor bottom contact 104. In one or more embodiments, if the optional conformal liner 108 is a non-conductive liner (e.g. a dielectric liner), it is also removed. In one embodiment, the pillars 112 and liner 108 are removed selectively to the capacitor bottom contact 104. As shown in FIG. 10A, self-aligned capacitor memory holes 118 are formed in the second dielectric material 114 and the first dielectric material 102. As illustrated in FIG. 10A, each self-aligned capacitor memory holes 118 has a bottom that is a top surface of the capacitor bottom contact 104 and opposing sidewalls that include a sidewall portion of first dielectric material 102 and second dielectric material 114. Generally, the aspect ratio of the self-aligned capacitor memory holes 118 refers to the ratio of the depth of the self-aligned capacitor memory holes 118 to the width of the self-aligned capacitor memory holes 118. In one embodiment, the aspect ratio of each self-aligned capacitor memory hole 118 is in an approximate range from about 1:1 to about 200:1. In one or more embodiments, the critical dimensions of the self-aligned capacitor memory holes 118 is substantially uniform along the depth of the self-aligned capacitor memory holes 118. As used herein, the term "substantially uniform" means that the critical dimension at the top of the self-aligned capacitor memory holes 118 is within ±5% of the critical dimension at the bottom of the self-aligned capacitor memory holes 118. In one or more embodiments, the critical dimension variation from the top of the self-aligned capacitor memory holes 118 to the bottom of the self-aligned capacitor memory holes 118 is within 5%.

In one embodiment, the pillars 112 are selectively removed using one or more of the dry and wet etching techniques known to one of ordinary skill in the art of electronic device manufacturing. In one embodiment, the pillars 112 are selectively wet etched by e.g., 5 wt. % of ammonium hydroxide ($NH_4OH$) aqueous solution at the temperature of about 80 degrees C. In one embodiment, hydrogen peroxide ($H_2O_2$) is added to the 5 wt. % $NH_4OH$ aqueous solution to increase the etching rate of the pillars 112. In one embodiment, the pillars 112 are selectively wet etched using hydrofluoric acid (HF) and nitric acid ($HNO_3$) in a ratio of 1:1. In one embodiment, the pillars 112 are selectively wet etched using HF and $HNO_3$ in a ratio of 3:7 respectively. In one embodiment, the pillars 112 are selectively wet etched using HF and $HNO_3$ in a ratio of 4:1, respectively. In one embodiment, the pillars 112 are selectively wet etched using HF and $HNO_3$ in a ratio of 30%: 70%, respectively. In one embodiment, the pillars 112 including tungsten, titanium or both titanium and tungsten are selectively wet etched using $NH_4OH$ and $H_2O_2$ in a ratio of 1:2, respectively. In one embodiment, the pillars 112 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 112 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 112 are selectively wet etched using HF, $HNO_3$ and acetic acid (AcOH) in a ratio of 4:4:3, respectively. In one embodiment, the pillars 112 are selectively dry etched using a bromotrifluoromethane (CBrF3) reactive ion etching (RIE) technique. In one embodiment, the pillars 112 are selectively dry etched using chlorine, fluorine, bromine or any combination thereof based chemistries. In one embodiment, the pillars 112 are selectively wet etched using hot or warm Aqua Regia mixture including HCl and $HNO_3$ in a ratio of 3:1, respectively. In one embodiment, the pillars 112 are selectively etched using alkali with oxidizers (potassium nitrate ($KNO_3$) and lead dioxide ($PbO_2$)). In one embodiment, the liner 108 is selectively removed using one or more of the dry and wet etching techniques known to one of ordinary skill in the art of electronic device manufacturing.

Figure 10B:
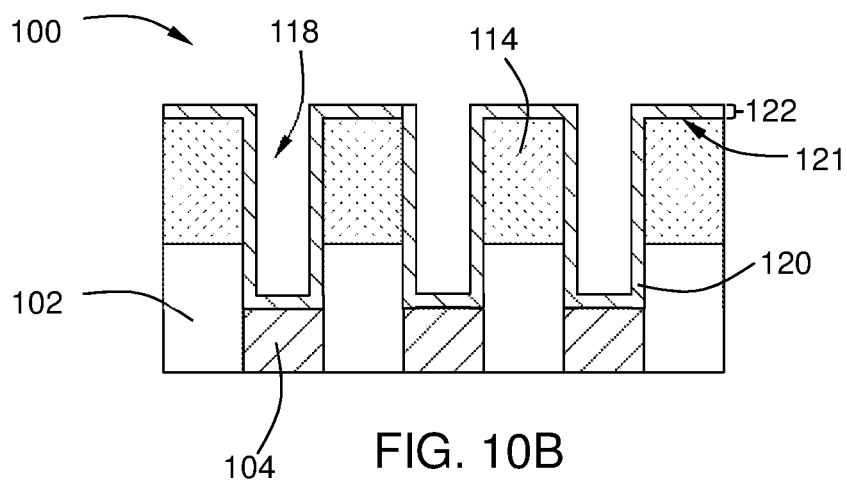
FIG. 10B illustrates a cross-section view of an electronic device according to one or more embodiments of the disclosure.

Referring to FIG. 10B, a first conductive material 120 is conformally deposited in the capacitor memory holes 118. The first conductive material 120 may be deposited by any deposition method known to one of skill in the art, including, but not limited to, ALD, CVD, or PVD. The first conductive material 120 may be any suitable material known to the skilled artisan. In one or more embodiments, the first conductive material 120 comprises one or more of metal mode titanium (MMTi), metal silicide, or highly doped polysilicon.

Figure 10C:
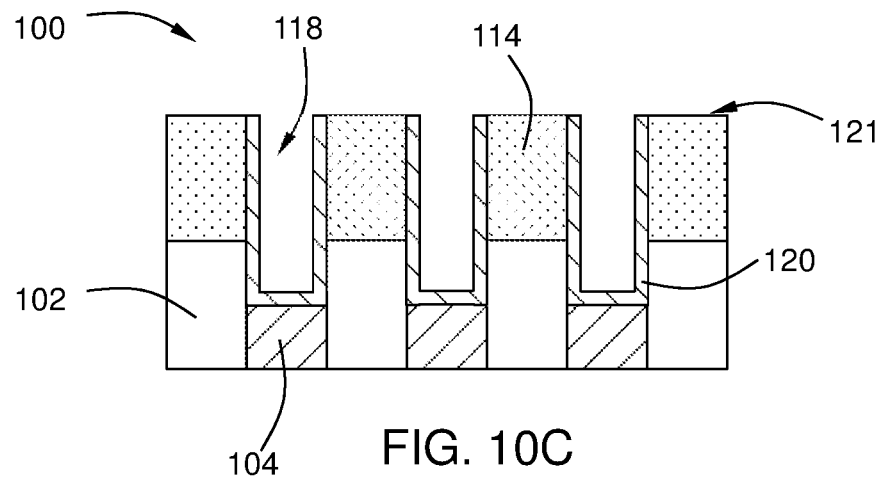
FIG. 10C illustrates a cross-section view of an electronic device according to one or more embodiments of the disclosure.

As illustrated in FIG. 10B, in one or more embodiments, a layer 122 of the first conductive material 120 is formed on the top surface 121 of the second dielectric material 114. Referring to FIG. 10C, the layer 122 of the first conductive material 120 formed on the top surface 121 of the second dielectric material 114 may be removed by any suitable technique known to one of skill in the art including, but not limited to, chemical mechanical planarization (CMP). In one or more embodiments, when the layer 122 of the first conductive material 120 formed on the top surface 121 of the second dielectric material 114 is removed, the first conductive material 120 is substantially coplanar with the top surface 121 of the second dielectric material 114.

Figure 10D:
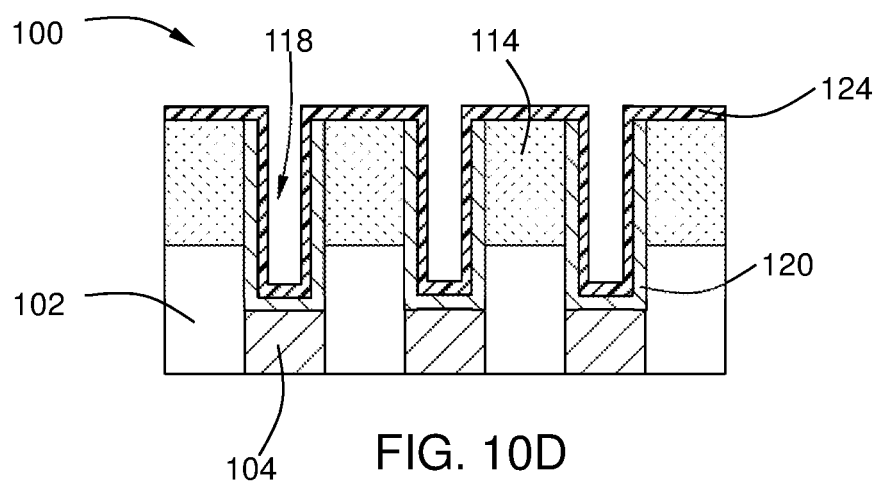
FIG. 10D illustrates a cross-section view of an electronic device according to one or more embodiments of the disclosure.

Referring to FIG. 10D, a third dielectric material 124 is conformally deposited in the capacitor memory holes 118 on the first conductive material 120. The third dielectric material 124 may be deposited by any deposition method known to one of skill in the art, including, but not limited to, ALD, CVD, or PVD. The third dielectric material 124 may be any suitable material known to the skilled artisan. In one or more embodiments, the third dielectric material 124 comprises a high-K dielectric. In one or more embodiments, the third dielectric material 124 comprises a high-K dielectric selected from one or more of aluminum oxide, hafnium oxide, or aluminum hafnium oxide (AlHfOx).

Figure 10E:
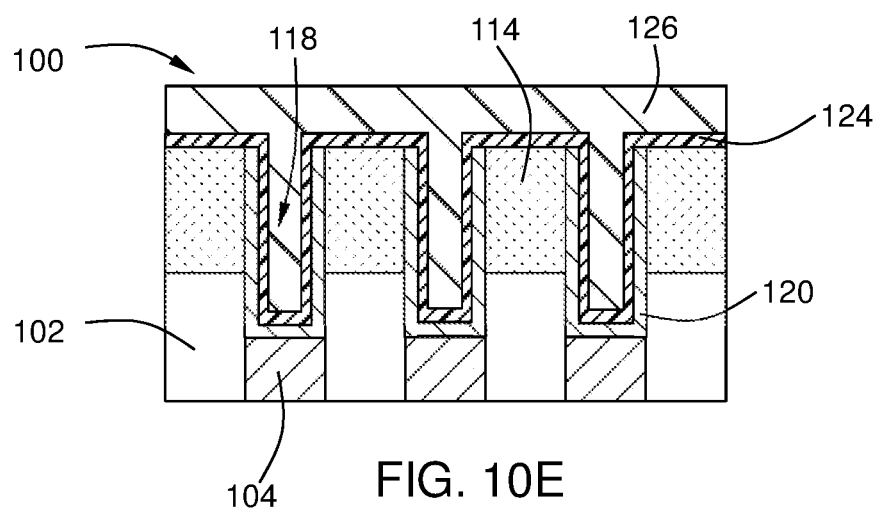
FIG. 10E illustrates a cross-section view of an electronic device according to one or more embodiments of the disclosure.

Referring to FIG. 10E, in one or more embodiments a second conductive material 126 is deposited on the third dielectric material 124 to form a DRAM capacitor. The second conductive material 126 may be deposited by any deposition method known to one of skill in the art, including, but not limited to, ALD, CVD, or PVD. The second conductive material 126 may be any suitable material known to the skilled artisan. In one or more embodiments, the second conductive material 126 comprises one or more of poly-silicon, metal, or metal silicide. In one or more embodiments, the poly-silicon may be doped by N-type or P-type dopants. In one or more embodiments, the capacitor bottom contact 104 is self-aligned with the first conductive material 120.

Figure 11:
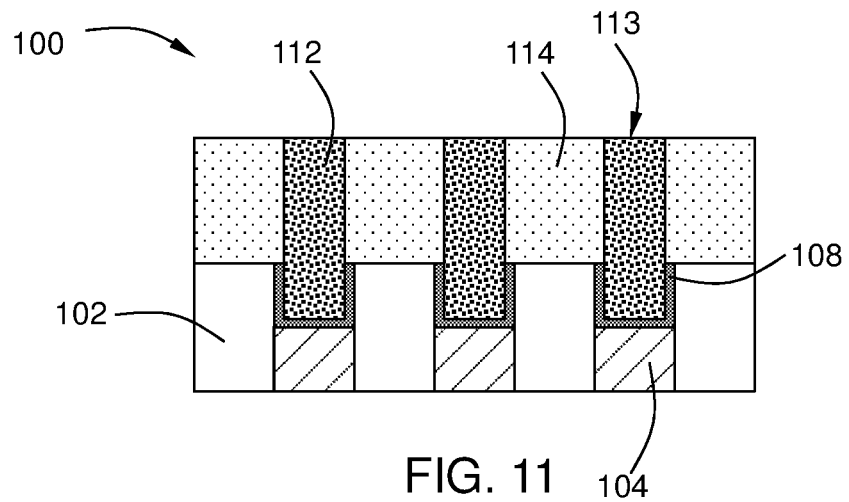
FIG. 11 illustrates a cross-section view of an electronic device according to one or more embodiments of the disclosure.

FIGS. 11-21 describe alternative embodiments of the disclosure. FIG. 11 is the same as FIG. 9 and is merely duplicated for convenience. Referring to FIG. 11, the overburden 116 of the second dielectric material 114 has been removed, such that the second dielectric material 114 is substantially coplanar with the top surface 113 of the pillars 112.

Figure 12:
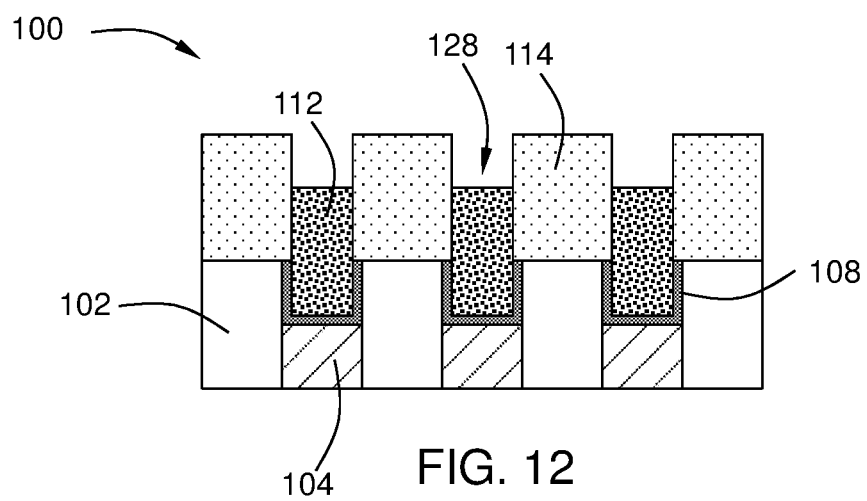
FIG. 12 illustrates a cross-section view of an electronic device according to one or more embodiments of the disclosure.
Figure 13:
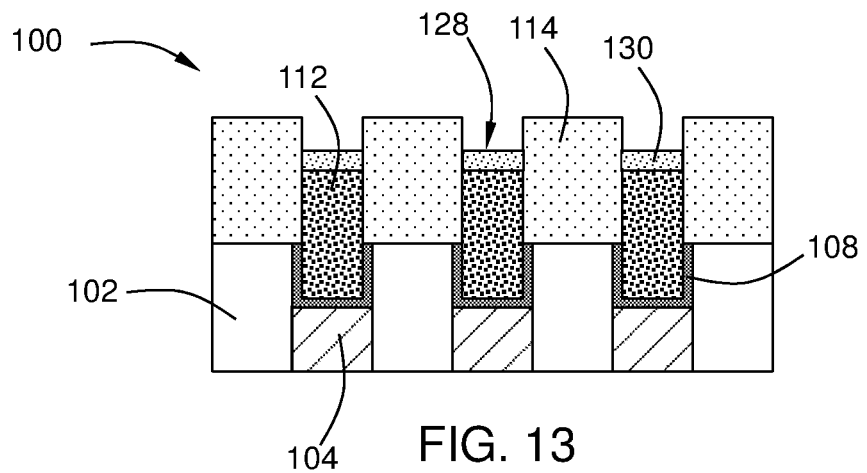
FIG. 13 illustrates a cross-section view of an electronic device according to one or more embodiments of the disclosure.
Figure 14:
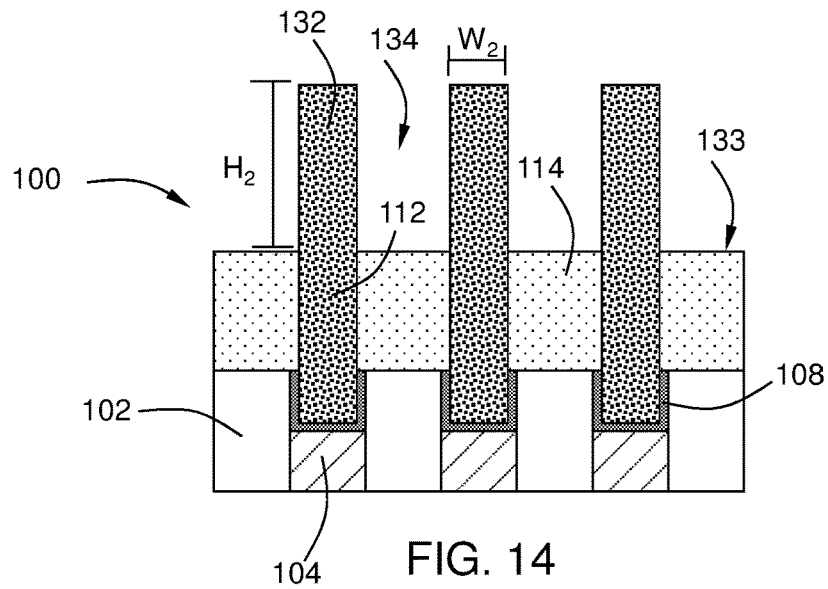
FIG. 14 illustrates a cross-section view of an electronic device according to one or more embodiments of the disclosure.

With reference to FIG. 12, in one or more embodiments, prior to forming the capacitor memory holes 118, the pillars 112 are selectively etched to form a second recess 128. Referring to FIGS. 13 and 14, second pillars 132 are grown in the second recess 128 on the pillars 112.

Second pillars 132 are formed on the pillars 112. Referring to FIG. 13, in one or more embodiments, self-aligned selective growth pillars 132 are formed using a seed gapfill layer 130 on pillars 112. In one or more embodiments, an optional liner may be deposited in the recess 128 and seed gapfill layer 130 is then deposited on the optional liner to grow the second pillars 132.

In one or more embodiments, the self-aligned growth second pillars 132 have a height $H_2$ of about 5 angstroms (Å) to about 10 microns (μm) that extends above the top surface 133 of the second dielectric material 114. In one or more embodiments, the height $H_2$ of the self-aligned growth second pillars 132 is substantially the same as the height $H_2$ of the self-aligned growth pillars 112. In other embodiments, the height $H_2$ of the self-aligned growth second pillars 132 is greater than the height $H_2$ of the self-aligned growth pillars 112. The width $W_2$ of the self-aligned growth second pillars 132 is in a range of about 0.5 nm to about 2000 nm. In one or more embodiments, the width $W_2$ of the self-aligned growth second pillars 132 is substantially the same as the width $W_1$ of the self-aligned growth pillars 112.

As shown in FIG. 14, the second pillars 132 extend substantially orthogonally from the top surface 133 of the second dielectric material 114. As shown in FIG. 14, the second pillars 132 extend along the same direction as the conductive lines of the capacitor bottom contact 104, and are separated by gaps 135.

With reference to FIG. 13, in one or more embodiments, a second seed gapfill layer 130 is deposited on the pillars 112. In one embodiment, the second seed gapfill layer 130 is a self-aligned selective growth seed film. In one or more embodiments, the second seed gapfill layer 130 is deposited on pillars 112 on capacitor bottom contact 104 on the top surface of the recessed conductive lines. In one or more embodiments, optional conformal liner 108 is present on the capacitor bottom contact 104. In one or more embodiments, the second seed gapfill layer 130 is a tungsten (W) layer, or other seed gapfill layer to provide selective growth second pillars 132. In some embodiments, the second seed gapfill layer 130 is a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, the second seed gapfill layer 130 is a tungsten (W) seed gapfill layer.

In one or more embodiments, the second seed gapfill layer 130 is deposited using one or more deposition techniques, such as but not limited to ALD, CVD, PVD, MBE, MOCVD, spin-on or other deposition techniques known to one of ordinary skill in the art of microelectronic device manufacturing.

In one or more embodiments, portions of the second seed gapfill layer 130 above the pillars 112 are expanded for example, by oxidation, nitridation, or other process to grow second pillars 132. In one embodiment, the second seed gap fill layer 130 is oxidized by exposure to an oxidizing agent or oxidizing conditions to transform the metal or metal containing second seed gapfill layer 130 to metal oxide second pillars 132. In one or more embodiments, second pillars 132 include an oxide of one or more metals listed above. In more specific embodiment, second pillars 132 include tungsten oxide (e.g., WO, $WO_3$ and other tungsten oxide). In one or more embodiments, second pillars 132 comprise the same material as pillars 112. In one or more embodiments, second pillars 132 comprise a material different from pillars 112.

The oxidizing agent can be any suitable oxidizing agent including, but not limited to, $O_2$, $O_3$, $N_2O$, $H_2O$, $H_2O_2$, CO, $CO_2$, $NH_3$, $N_2/Ar$, $N_2/He$, $N_2/Ar/He$ or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In one or more embodiments, the second pillars 132 are formed by oxidation of the second seed gapfill layer 130 at any suitable temperature depending on, for example, the composition of the second seed gapfill layer 130 and the oxidizing agent. In some embodiments, the oxidation occurs at a temperature in an approximate range of about 25° C. to about 800° C. In some embodiments, the oxidation occurs at a temperature greater than or equal to about 150° C.

Figure 15:
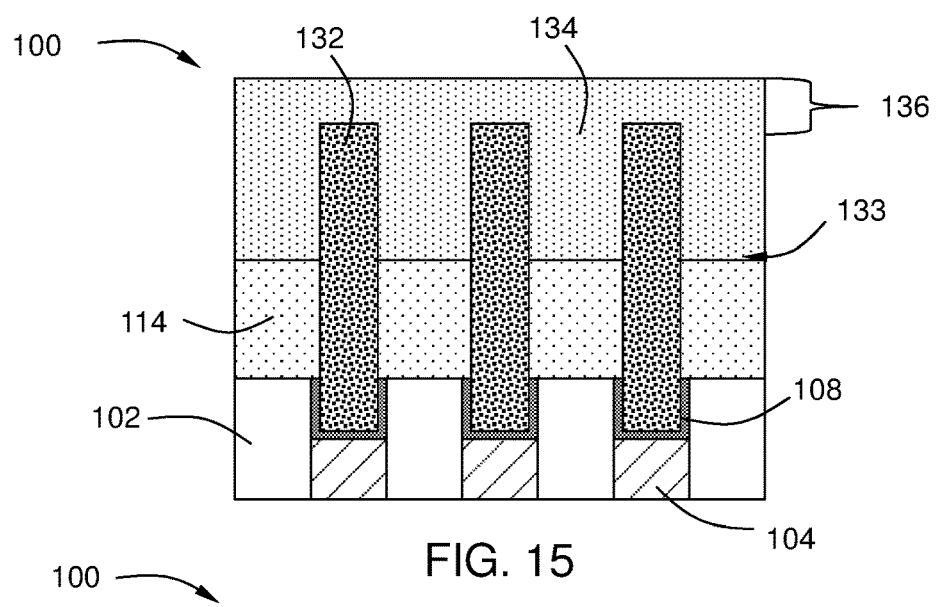
FIG. 15 illustrates a cross-section view of an electronic device according to one or more embodiments of the disclosure.

With reference to FIG. 15, a fourth dielectric material 134 is deposited on the second dielectric material 114. In one or more embodiments, the fourth dielectric material 134 can be any suitable material known to the skilled artisan. In one or more embodiments, the fourth dielectric material 134 comprises silicon oxide or silicon nitride. In one or more embodiments, the fourth dielectric material 134 is the same material as the second dielectric material 114. In one or more embodiments, the fourth dielectric material 134 is the same material as the first dielectric material 102.

Figure 16:
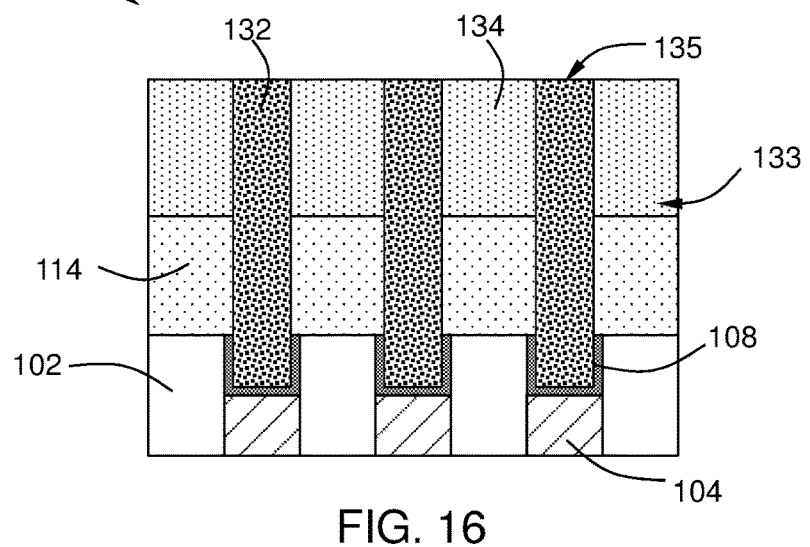
FIG. 16 illustrates a cross-section view of an electronic device according to one or more embodiments of the disclosure.

As illustrated in FIG. 15, in one or more embodiments, an overburden 136 of the fourth dielectric material 134 may be formed. Referring to FIG. 16, the overburden 136 may be removed by any suitable technique known to one of skill in the art including, but not limited to, chemical mechanical planarization (CMP), dry etching, or wet etching. In one or more embodiments, when the overburden 136 of the fourth dielectric material 134 is removed, the fourth dielectric material 134 is substantially coplanar with the top surface 135 of the second pillars 132.

While FIGS. 11-16 illustrate two layers of stacked pillars and dielectric layers, the skilled artisan recognizes that the structures and methods described in FIGS. 11-16 may be repeated multiple times to produce more than two stacks of pillars and dielectric layers. In some embodiments, there are three stacks of pillars and dielectric layers. In some embodiments, there are four stacks of pillars and dielectric layers. In some embodiments there are five or more stacks of pillars and dielectric layers. Additional stacks of pillars and dielectric layers will increase the height/depth of the capacitor that may be formed. The method of one or more embodiments advantageously leads to a capacitor self-aligned with the capacitor bottom contact, resulting in a uniform critical dimension and increased height of the capacitor. As used herein, the term "substantially uniform" means that the critical dimension at the top of the self-aligned capacitor memory holes (or capacitor memory channel(s)) is within ±5% of the critical dimension at the bottom of the self-aligned capacitor memory holes (or capacitor memory channel(s)). In one or more embodiments, the critical dimension variation from the top of the self-aligned capacitor memory holes to the bottom of the self-aligned capacitor memory holes is within 5%.

Figure 17:
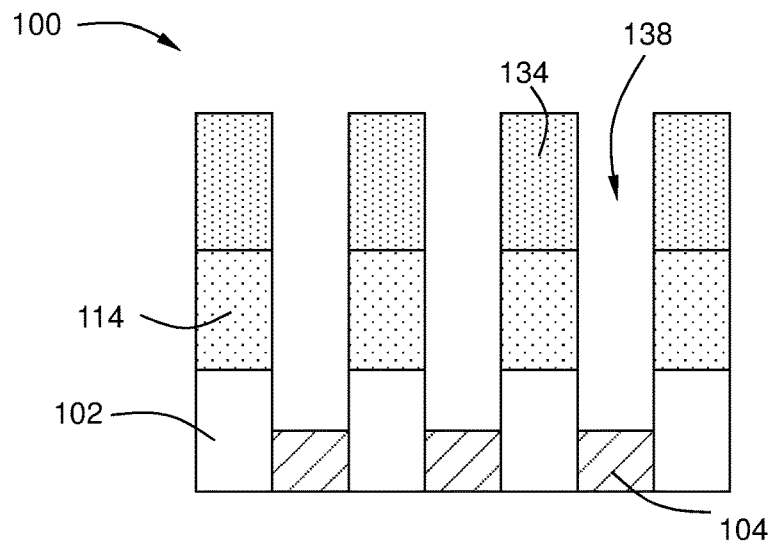
FIG. 17 illustrates a cross-section view of an electronic device according to one or more embodiments of the disclosure.

Referring to FIG. 17, in one or more embodiments, the second pillars 132 and pillars 112 are selectively removed to form capacitor memory holes 138. In one or more embodiments, the capacitor memory holes 138 are self-aligned with the capacitor bottom contact 104. In one or more embodiments, the self-aligned capacitor memory holes 138 have a minimum width that is equal to the width of the self-aligned growth pillars 132 and the self-aligned growth pillars 112.

As shown in FIG. 17, the second pillars 132 and pillars 112 are removed selectively to the capacitor bottom contact 104. In one or more embodiments, if the optional conformal liner 108 is a non-conductive liner (e.g. dielectric liner), it is also removed. In one or more embodiments, trimming of the second dielectric material 114 and the fourth dielectric material 134 may be necessary to ensure that the side walls of the capacitor memory holes 138 are substantially uniform. In one embodiment, the second pillars 132, pillars 112 and liner 108 are removed selectively to the capacitor bottom contact 104. As shown in FIG. 17, self-aligned capacitor memory holes 138 are formed in the fourth dielectric material 134, second dielectric material 114, and the first dielectric material 102. As illustrated in FIG. 17, each self-aligned capacitor memory hole 118 has a bottom that is a top surface of the capacitor bottom contact 104 and opposing sidewalls that include a sidewall portion of first dielectric material 102, second dielectric material 114, and fourth dielectric material 134. Generally, the aspect ratio of the self-aligned capacitor memory holes 138 refers to the ratio of the depth of the self-aligned capacitor memory holes 138 to the width of the self-aligned capacitor memory holes 138. In one embodiment, the aspect ratio of each self-aligned capacitor memory hole 138 is in an approximate range from about 1:1 to about 200:1, or from about 10:1 to about 200:1, or from about 200:1 to about 100:1. In one or more embodiments, the critical dimension of the self-aligned capacitor memory holes 138 is substantially uniform along the depth of the self-aligned capacitor memory holes 138. As used herein, the term "substantially uniform" means that the critical dimension at the top of the self-aligned capacitor memory hole 138 is within ±5% of the critical dimension at the bottom of the self-aligned capacitor memory holes 138. In one or more embodiments, the critical dimension variation from the top of the self-aligned capacitor memory holes 138 to the bottom of the self-aligned capacitor memory holes 138 is within 5%.

In one embodiment, the second pillars 132 and pillars 112 are selectively removed using one or more of the dry and wet etching techniques known to one of ordinary skill in the art of electronic device manufacturing. In one embodiment, the second pillars 132 and pillars 112 are selectively wet etched by e.g., 5 wt. % of ammonium hydroxide ($NH_4OH$) aqueous solution at the temperature of about 80 degrees C. In one embodiment, hydrogen peroxide ($H_2O_2$) is added to the 5 wt. % $NH_4OH$ aqueous solution to increase the etching rate of the second pillars 132 and pillars 112. In one embodiment, the second pillars 132 and pillars 112 are selectively wet etched using hydrofluoric acid (HF) and nitric acid ($HNO_3$) in a ratio of 1:1. In one embodiment, the second pillars 132 and pillars 112 are selectively wet etched using HF and $HNO_3$ in a ratio of 3:7 respectively. In one embodiment, the second pillars 132 and pillars 112 are selectively wet etched using HF and $HNO_3$ in a ratio of 4:1, respectively. In one embodiment, the second pillars 132 and pillars 112 are selectively wet etched using HF and $HNO_3$ in a ratio of 30%:70%, respectively. In one embodiment, the second pillars 132 and pillars 112 including tungsten, titanium or both titanium and tungsten are selectively wet etched using $NH_4OH$ and $H_2O_2$ in a ratio of 1:2, respectively. In one embodiment, the second pillars 132 and pillars 112 are selectively wet etched using 305 grams of potassium ferricyanide ($K_3Fe(CN)_6$), 44.5 grams of sodium hydroxide (NaOH) and 1000 ml of water ($H_2O$). In one embodiment, the second pillars 132 and pillars 112 are selectively wet etched using diluted or concentrated one or more of the chemistries including hydrochloric acid (HCl), $HNO_3$, sulfuric acid ($H_2SO_4$), HF, and $H_2O_2$. In one embodiment, the second pillars 132 and pillars 112 are selectively wet etched using HF, $HNO_3$ and acetic acid (AcOH) in a ratio of 4:4:3, respectively. In one embodiment, the second pillars 132 and pillars 112 are selectively dry etched using a bromotrifluoromethane (CBrF3) reactive ion etching (RIE) technique. In one embodiment, the second pillars 132 and pillars 112 are selectively dry etched using chlorine, fluorine, bromine or any combination thereof based chemistries. In one embodiment, the second pillars 132 and pillars 112 are selectively wet etched using hot or warm Aqua Regia mixture including HCl and $HNO_3$ in a ratio of 3:1, respectively. In one embodiment, the second pillars 132 and pillars 112 are selectively etched using alkali with oxidizers (potassium nitrate (KNO$_3$) and lead dioxide (PbO$_2$)). In one embodiment, the liner 108 is selectively removed using one or more of the dry and wet etching techniques known to one of ordinary skill in the art of electronic device manufacturing.

Figure 18:
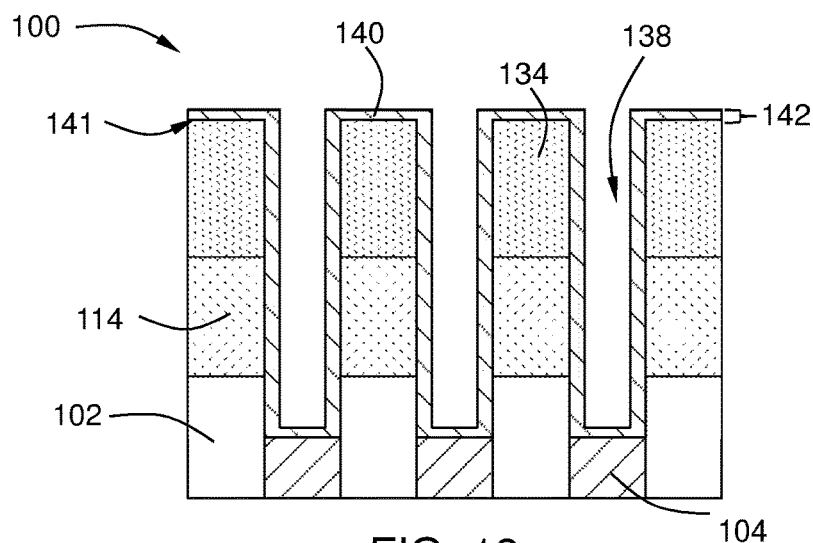
FIG. 18 illustrates a cross-section view of an electronic device according to one or more embodiments of the disclosure.

Referring to FIG. 18, a first conductive material 140 is continuously and conformally deposited in the capacitor memory holes 138 and on the top surface 141 of the fourth dielectric material. The first conductive material 140 may be deposited by any deposition method known to one of skill in the art, including, but not limited to, ALD, CVD, or PVD. The first conductive material 140 may be any suitable material known to the skilled artisan. In one or more embodiments, the first conductive material 140 comprises one or more of metal mode titanium (MMTi), metal silicide, or highly doped poly-silicon.

Figure 19A:
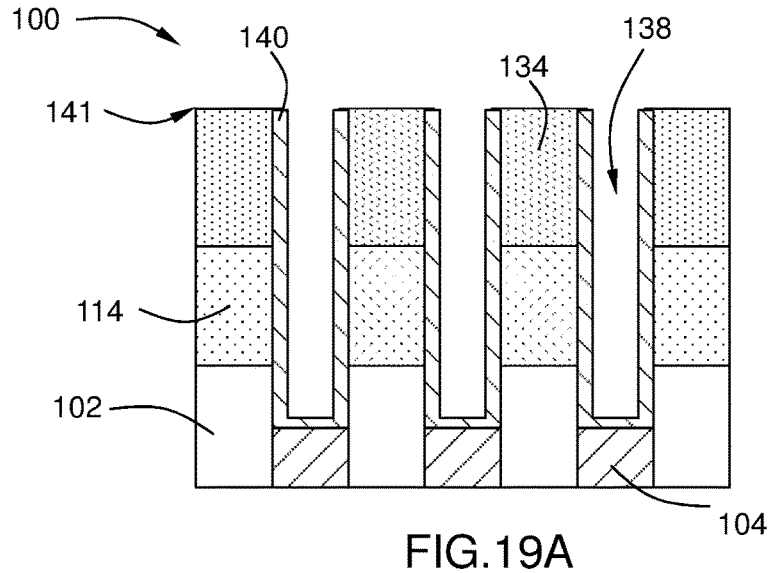
FIG. 19A illustrates a cross-section view of an electronic device according to one or more embodiments of the disclosure.

As illustrated in FIG. 18, in one or more embodiments, an overburden 142 of the first conductive material 140 is formed on the top surface 141 of the fourth dielectric material 134. Referring to FIG. 19A, the overburden 142 of the first conductive material 140 formed on the top surface 141 of the fourth dielectric material 134 may be removed by any suitable technique known to one of skill in the art including, but not limited to, chemical mechanical planarization (CMP), dry etching, or wet etching. In one or more embodiments, when the overburden 142 of the first conductive material 140 formed on the top surface 141 of the fourth dielectric material 134 is completely removed, the first conductive material 140 is substantially coplanar with the top surface 141 of the fourth dielectric material 134. Without intending to be by bound by theory, it is believed that, with the complete removal of the overburden 142, each capacitor memory hole 138 will be formed into one memory capacitor.

Figure 19B:
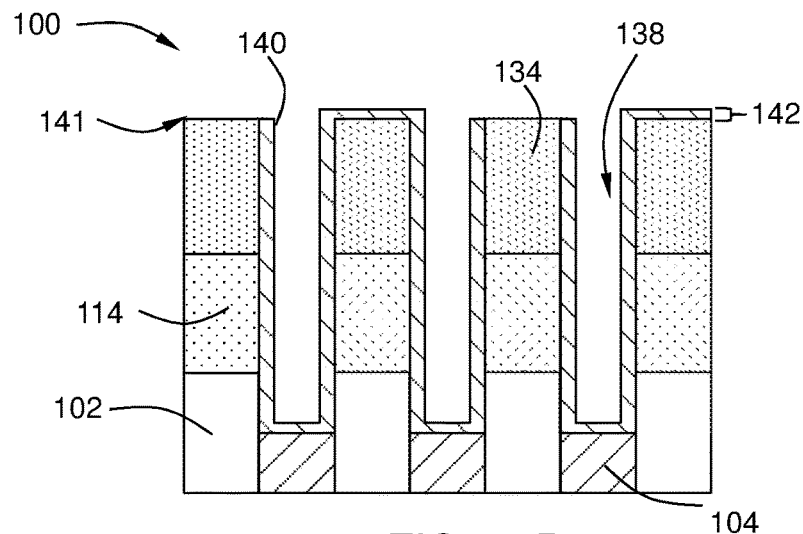
FIG. 19B illustrates a cross-section view of an electronic device according to one or more embodiments of the disclosure.

Referring to FIG. 19B, in one or more embodiments, the overburden 142 of the first conductive material 140 formed on the top surface 141 of the fourth dielectric material 134 is partially removed to partially separate the first conductive material 140. Without intending to be bound by theory, it is believed that, in this circumstance, the total capacitor for one memory cell will be made by more than one adjacent capacitor memory hole 138.

Figure 20:
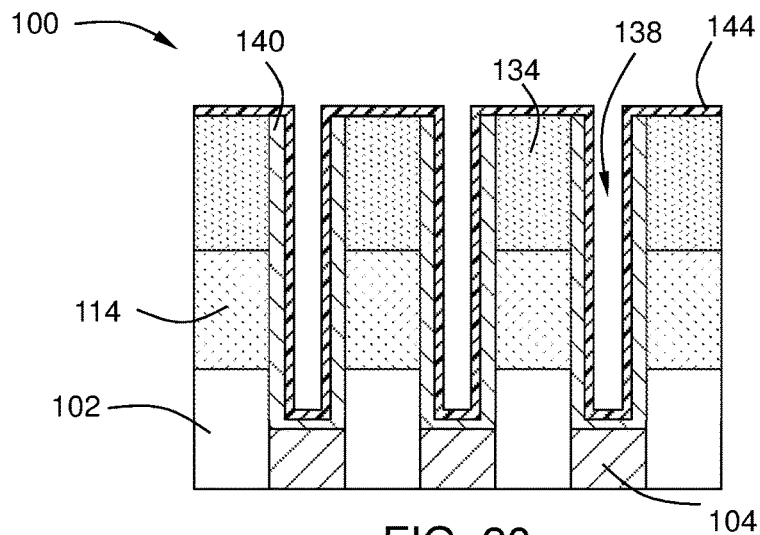
FIG. 20 illustrates a cross-section view of an electronic device according to one or more embodiments of the disclosure.

Referring to FIG. 20, a third dielectric material 144 is conformally deposited in the capacitor memory holes 138 on the first conductive material 140. The third dielectric material 144 may be deposited by any deposition method known to one of skill in the art, including, but not limited to, ALD, CVD, or PVD. The third dielectric material 144 may be any suitable material known to the skilled artisan. In one or more embodiments, the third dielectric material 144 comprises a high-K dielectric. In one or more embodiments, the third dielectric material 144 comprises a high-K dielectric selected from one or more of aluminum oxide, hafnium oxide, or aluminum hafnium oxide (AlHfOx).

Figure 21:
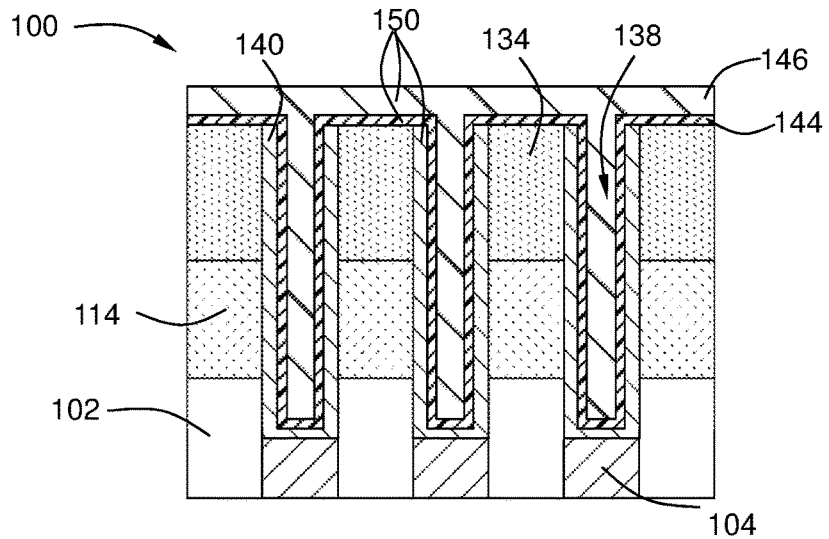
FIG. 21 illustrates a cross-section view of an electronic device according to one or more embodiments of the disclosure.

Referring to FIG. 21, in one or more embodiments a second conductive material 146 is deposited on the third dielectric material 144 to form a DRAM capacitor. The second conductive material 146 may be deposited by any deposition method known to one of skill in the art, including, but not limited to, ALD, CVD, or PVD. The second conductive material 126 may be any suitable material known to the skilled artisan. In one or more embodiments, the second conductive material 146 comprises one or more of poly-silicon, highly doped poly-silicon, metal, or metal silicide. In one or more embodiments, the capacitor bottom contact 104 is self-aligned with the first conductive material 140.

Referring to FIG. 21, one or more embodiments provide a DRAM capacitor comprising: a capacitor bottom contact 104 and a first dielectric material 102 on a substrate. A second dielectric material 114 is on the first dielectric material 102. A fourth dielectric material 134 is on the second dielectric material 114. A capacitor memory channel 138 is formed through the fourth dielectric material 134, the second dielectric material 114, and the first dielectric material 102. A capacitor 150 is formed in the capacitor memory channel 138. The capacitor 150 is self-aligned with the capacitor bottom contact 104. In one or more embodiments, the capacitor 150 comprises a first conductive material 140, a third dielectric material 144 on the first conductive material 140, and a second conductive material 146 on the third dielectric material 144. In one or more embodiments, the capacitor 150 has a top and a bottom, and a critical dimension of the top is substantially the same as a critical dimension of the bottom.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing a DRAM capacitor, the method comprising:
   selectively etching a capacitor bottom contact from a substrate comprising the capacitor bottom contact and a first dielectric material to form a recess;
   selectively depositing a seed layer in the recess on the capacitor bottom contact and oxidizing the seed layer to form pillars, the pillars extending substantially orthogonally from a top surface of the substrate and extending in the same direction as the capacitor bottom contact;
   depositing a second dielectric material on the first dielectric material;
   selectively removing the pillars to form capacitor memory holes;
   conformally depositing a first conductive material in the capacitor memory holes;
   conformally depositing a third dielectric material on the first conductive material; and
   depositing a second conductive material on the third dielectric material to form the DRAM capacitor, wherein the capacitor bottom contact is self-aligned with the first conductive material.

2. The method of claim 1, further comprising, prior to forming the capacitor memory holes, selectively etching the pillars to form a second recess and forming second pillars on the pillars.

3. The method of claim 2, wherein forming the second pillars comprises selectively depositing a second seed layer in the second recess on the pillars, wherein the second pillars are formed from the second seed layer.

4. The method of claim 1, wherein the pillars comprise one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), or lanthanum (La).

5. The method of claim 2, further comprising, prior to forming the second recess, removing an overburden of the second dielectric material such that a top surface of the second dielectric material is substantially coplanar with a top surface of the pillars.

6. The method of claim 2, further comprising depositing a fourth dielectric material on the second dielectric material.

7. The method of claim 1, wherein forming the capacitor memory holes comprises selectively removing the pillars.

8. The method of claim 1, wherein the first dielectric material and the second dielectric material independently comprise one or more of silicon oxide or silicon nitride.

9. The method of claim 6, further comprising, prior to forming the capacitor memory holes, removing an overburden of the fourth dielectric material such that a top surface of the fourth dielectric material is substantially coplanar with a top surface of the second pillars.

10. The method of claim 1, wherein forming the pillars comprises selectively depositing a seed layer in the recess on the capacitor bottom contact, wherein the pillars are formed from the seed layer.

11. The method of claim 1, further comprising, prior to depositing the first conductive material, removing the conformal liner.

12. The method of claim 1, wherein the capacitor bottom contact comprises one or more of a metal, a metal silicide, poly-silicon, or EPI-silicon.

13. The method of claim 1, wherein the first conductive material comprises one or more of metal mode titanium (MMTi), metal silicide, or highly doped poly-silicon.

14. The method of claim 1, wherein the third dielectric material comprises a high-κ dielectric selected from one or more of aluminum oxide, hafnium oxide, AlHfOx.

15. The method of claim 1, wherein the second conductive material comprises one or more of poly-silicon, metal, or metal silicide.

16. A method of manufacturing a DRAM capacitor, the method comprising:
   providing a substrate having a capacitor bottom contact and a first dielectric material;
   selectively etching the capacitor bottom contact to form a first recess;
   depositing a conformal liner in the first recess;
   selectively depositing a first seed layer in the first recess on the capacitor bottom contact;
   forming first pillars from the first seed layer;
   depositing a second dielectric material on the first dielectric material to form an overburden of the second dielectric material;
   removing the overburden of the second dielectric material such that a top surface of the second dielectric material is substantially coplanar with a top surface of the first pillars;
   selectively etching the first pillars to form a second recess;
   selectively depositing a second seed layer in the second recess on the first pillars;
   forming second pillars from the second seed layer;
   depositing a fourth dielectric material on the second dielectric material to form an overburden of the fourth dielectric material;
   removing the overburden of the fourth dielectric material such that a top surface of the fourth dielectric material is substantially coplanar with a top surface of the second pillars;
   selectively removing the first pillars and the second pillars to form capacitor memory holes;
   removing the conformal liner; and forming a capacitor in the capacitor memory holes by conformally depositing a first conductive material in the capacitor memory holes, conformally depositing a third dielectric material on the first conductive material, and depositing a second conductive material on the third dielectric material to form the DRAM capacitor,
wherein the capacitor is self-aligned with capacitor bottom contact.

* * * * *